United States Patent [19]

Bragger

[11] Patent Number: 5,183,512

[45] Date of Patent: Feb. 2, 1993

[54] METHOD OF CLEANING SEMICONDUCTOR WAFER AND COMPUTER DISKS BY PURIFIED WATER TREATED WITH ELECTRIC AC SIGNAL

[75] Inventor: Barry L. Bragger, Colchester, Conn.

[73] Assignee: Aquotech, Inc., Colchester, Conn.

[21] Appl. No.: 751,909

[22] Filed: Aug. 29, 1991

[51] Int. Cl.$^5$ .................... B08B 3/04; C02F 1/48
[52] U.S. Cl. .................................. 134/1; 134/10; 134/26; 210/748
[58] Field of Search ............ 134/1, 26, 10, 24, 28, 134/29; 210/748; 437/946; 148/DIG. 17

[56] References Cited

U.S. PATENT DOCUMENTS

| | | | |
|---|---|---|---|
| 4,027,686 | 6/1977 | Shortes et al. | 134/30 X |
| 4,156,619 | 5/1979 | Griesshammer | 134/26 X |
| 4,865,748 | 9/1989 | Morse | 210/748 X |
| 4,917,782 | 4/1990 | Davies | 210/748 X |
| 4,963,268 | 10/1990 | Morse | 210/748 X |
| 4,997,490 | 3/1991 | Vetter et al. | 134/26 |
| 5,089,145 | 2/1992 | Fern | 210/748 |

*Primary Examiner*—Theodore Morris
*Assistant Examiner*—Saeed Chaudhry
*Attorney, Agent, or Firm*—Sprung Horn Kramer & Woods

[57] ABSTRACT

Described is a process for utilizing an electric AC signal of a frequency preferably between 0.1 kHz and 1 GHz to modify and otherwise enhance the properties of de-ionized water used for the purpose of cleaning semiconductor wafers and computer storage disks before, during and after processing. Such treatment of the cleaning water enhances its ability to remove process chemicals, remove particulates, and otherwise improve the speed and economy of the cleaning process thereby directly improving the final yield of the chip or disk making process.

12 Claims, 3 Drawing Sheets

METHOD OF CLEANING SEMICONDUCTOR WAFER AND COMPUTER DISKS BY PURIFIED WATER TREATED WITH ELECTRIC AC SIGNAL

BACKGROUND OF THE INVENTION

The present invention relates to a method for manufacturing semiconductor wafers and computer storage disks. More particularly, the present invention relates to a method of cleaning semiconductor wafers and computer storage disks during their process of manufacture.

Manufacture of Semiconductor Chips

Ultrapure crystals of silicon, gallium arsenide, or other similar materials are manufactured for further processing into so-called semiconductor wafers. It is within these wafers that semiconductor integrated circuits or "chips" are made. It is these chips which are the useful end product of wafer fabrication.

During their various processing steps these wafers are subjected to additions of layers, subtractions of layers, physical and chemical alterations and modifications of layers, and various masking operations which isolate or subject various micron and submicron sized regions to the aforementioned processing steps. The desired end result is the manufacture of a chip—a tiny, highly complex, three dimensional electronic circuit which will flawlessly and reliably perform the function for which it was designed.

This functioning chip is then packaged and put to work as a functional circuit; the successful completion of the manufacturing process. The success of the process is generally measured as a function of the overall "yield" achieved; that is, the number of successful devices made as compared to the total number of devices originally printed on the wafer.

The deionized water used in the fabrication of semiconductor chips is the purest water than can be made. It is treated and filtered so that its electrical resistance is greater than or equal to eighteen million ohms per centimeter (18 Meg Ohms) as measured by a precision Ohm meter. Its particulate contamination level must be less than 1 particle of 0.2 microns or greater per ml as measured by an optical particle counter. It is also constantly recirculated to thwart the possibility of bacterial growth.

There are various process chemicals (etchants, mineral acids, developers, photoresists, etc.) which come in contact with the wafer's surfaces during processing. After being utilized for a particular purpose (such as masking an area prior to etching) these process chemicals must be removed completely so that the next process might begin.

The final step in the removal of the process chemicals is a comprehensive cleaning in a solvent such as ultrapure deionized water. Any residual contamination on the wafer's surface will adversely effect the next processing step thereby decreasing yield. The desired end result of cleaning is a wafer surface completely free of particulates and unwanted organic compounds or ions. Naturally the water cannot itself be a source of contamination; hence the extreme care undertaken in its processing.

Practically it is an impossibility to remove all contamination from the water, the wafer surfaces, or the process chemicals themselves. For this reason incremental technological steps in cleaning are constantly being introduced.

Particulates trapped upon the surface of the wafer or electrostatically affixed to the circuitry can cause electrical shorts which might compromise the operation of the microcircuitry thereby rendering useless the chip etched on that part of the wafer. Organic or ionic contaminants can diffuse into the wafer or lay across the surfaces and can cause excess electronic bleed currents, parasite capacitances, and other undesirable electronic effects which, as well, can make the end product unusable. Further processing of this contaminated chip only adds cost to a worthless end product. This is expensive in terms of material costs, labor costs, and process scheduling interruptions.

Raw water is generally obtained from municipal water authorities, private processing plants, etc. and is processed through various filters and mechanisms so as to produce the ultraclean and ultrapure deionized water needed in these processes. The water is then piped, usually via polyperfluoroethylene (Teflon) conduits, to its point of use; usually one of the commonly available deluge, spray, cascade, ultrasonic, or other design rinsers from the wafer surface. Thereafter the used water is treated to remove hazardous chemicals and is then discarded. Naturally this end processing and disposal is, itself, a costly process.

Manufacture of Computer Storage Disks

The purpose of a computer disk drive is to magnetically store huge amounts of coded information while allowing rapid and random access to these data. This function is accomplished by coating a rigid medium with a magnetically sensitive material and spinning this disk rapidly while read/write heads are permitted to come into close proximity of the magnetic material thereby effecting the magnetic nature of the material.

It is a function of the physics of the system that greater densities of data storage are achieved when the thickness of the deposited magnetically sensitive material is substantially decreased. In addition, so as to increase data access time, the read/write heads must travel in extraordinarily close proximity to the magnetically sensitive material, often not more than 0.5 microns above the surface. Because of these two facts it becomes vitally important for disk drive manufacturers to provide the cleanest, flattest, most highly polished surfaces imaginable for the manufacture of their product.

Highly polished raw plates of, for example, an alloy of aluminum, are exquisitely cleaned and are checked for flatness, often through the use of laser interferometric equipment. After thorough cleaning they are placed into a chemical vapor deposition (CVD) chamber where a magnetically sensitive medium is precisely vacuum deposited upon the plates at elevated temperature and diminished pressure. Once coated the plates are removed and are cleaned to remove all particulate matter. This cleaning must be aggressive enough to remove any particulates; however, it must be gentle enough so as not to adversely effect the very thin magnetic coating.

Any particulate matter remaining upon the plate might cause that section of the disk to be unable to store data. A "bad sector" would be the result and a small amount of storage area would be lost. Because of the prevalence of bad sectors in the manufacture of disk drives, all manufacturers "derate" the specifications of their disk drives so that the final product has at least the amount of memory they are specifying. That is to say, a disk drive might be designed to store 50 MB (50 megabytes or 50 million pieces of information) but the manufacturer might sell this drive as a 45 MB drive to allow for the all-too-frequent bad sectors which form during the manufacturing process. The disk drive that the consumer purchases as a 45 MB drive might actually have up to 50 MB of designed space but anything between 45 MB and 50 MB of available space.

Particulate matter remaining upon the surface of the drive can be even more problematic because of the extraordinarily small clearances involved in read/write head operation. Since the head travels about 1 micron above the surface, any particles at about that size might collide with the read/write head resulting in the so-called "head crash" which can be so devastating to the data.

In a "head crash" the read/write head actually contacts the surface of the disk. When this happens, because of the extreme thinness of the coating, the magnetically sensitive material is invariably scratched or otherwise damaged. The least damaging result of this occurrence is a loss of data in that locality. Even more unfortunate is the high probability that the head will begin to bounce and will contact the disk in several spots. One or many whole disk tracks can be ruined this way.

Furthermore, the head crash invariably creates its own particles which then propagate additional head crashes. This self-propagating destruction can destroy the majority of the data on a disk before the user could possibly turn off the computer. The data are usually unrecoverable and the drive is almost always discarded.

Fortunately, a contaminated disk is normally spotted at the manufacturing level. This is simply because a contaminated disk will almost always destroy itself during its initial burn in period. Obviously, therefore, the more units which pass this burn in, the more available units there will be to ship, and the more profit the manufacturer can achieve. Better disk cleaning is therefore an important factor in increasing yield.

SUMMARY OF THE INVENTION

A principal object of the present invention is to provide an inexpensive, non-chemical cleaning agent for semiconductor wafers and computer storage disks which is more effective than purified deionized water.

This object, as well as other objects which will become apparent from the discussion that follows, are achieved, according to the present invention, by treating purified water which is, or which will subsequently be used in rinsing semiconductor wafers or computer storage disks, with an electrical AC signal.

More particularly, the present invention involves applying an electrical AC signal to the water in the manner disclosed in the U.S. Pat. Nos. 4,865,748 and 4,963,268 to D. E. Morse, which disclosure is incorporated herein by reference. Equipment for treating water with an electrical AC signal at a selected frequency is available commercially from Aqua Dynamics Group Corp. in Adamsville, Tennessee. Such devices are sold or leased under the name "QED" for "Quantum Electronic Device".

It has been discovered, remarkably, that the treatment of water with an electrical AC signal by means of the aforementioned device changes the cleaning characteristics of the water, in a manner to be more fully described hereinbelow, thereby enabling the water to more fully carry out the required cleaning tasks.

In a preferred embodiment of the invention the electric AC signal is injected into the cleaning water through a pair of highly polished platinum electrodes mounted in a polyperfluoroethylene (Teflon) carrier, or by other means as is appropriate so as to inject the signal into the water. This signal may be injected into the water prior to or during processing, injected into the processed water piping or conduits, or directly injected at the point of use cleaning stations. The enhanced cleaning properties imparted unto the water remain undiminished regardless of the point of signal injection as the processed water does have a memory.

The treatment method according to the invention actually changes the property of the water thereby making it a better cleaning agent without necessitating the addition of any surfactants or other chemicals which might prove unacceptable to the fabrication process. Surfactants and other chemicals themselves can contribute to contamination. In addition, certain ionic surfactants can "poison" a wafer. Finally, these added chemicals add to the overall cost of waste water processing as they must be removed prior to disposal or reuse of the used water.

Because of the change imparted unto the deionized water by the injection of the AC electrical signal, the treated water is able to more efficiently remove the undesirable particulates, organics, and ionic contaminants thereby achieving a higher level of cleaning efficiency, ultimately achieving a high process yield. Because it is the water itself that is undergoing the change, the mechanism by which the water is introduced onto the wafer is irrelevant to the scope of this treatment. That is, the design of the actual rinsing stations is not a factor in the use of this treatment process.

Should a higher level of cleaning efficiency not be required (the process yields being acceptably high, for example) the treated water can still improve the process by performing an equivalent level of cleaning efficiency in a shorter period of time and with a lesser volume of water. This serves to enhance throughput and decrease costs of water generation, waste water disposal, and lowers filter replacement costs.

The true advantage of the treated water shows in its ability to clean a surface far better than untreated water. Many particulates are more strongly attracted to the wafer surface than they are attracted to deionized water. This may be because untreated deionized water lacks sufficient solvation strength. When this occurs it is impossible for the cleaner to dislodge the particle. A contamination event has occurred and the effected chip is usually useless. Yield has suffered.

Treated deionized water, on the other hand, has a greater ability to attract the particulate contaminant; that is to say, it is a stronger solvent. Treated water cleans the surface better. This serves to decrease the incidence of contamination events ultimately leading to improved overall process yield.

Furthermore, treated water, being a stronger solvent, dissolves ionics and organics more efficiently. Even those organics which are nearly insoluble in untreated deionized water will show more solubility in treated deionized water. When these undesirable contaminants are washed away process yields also tend to rise.

The preferred embodiments of the present invention will now be described with reference to the accompanying drawings.

BRIEF DESCRIPTIONS OF THE DRAWINGS

DETAILED DESCRIPTION OF THE INVENTION

Figure 1:
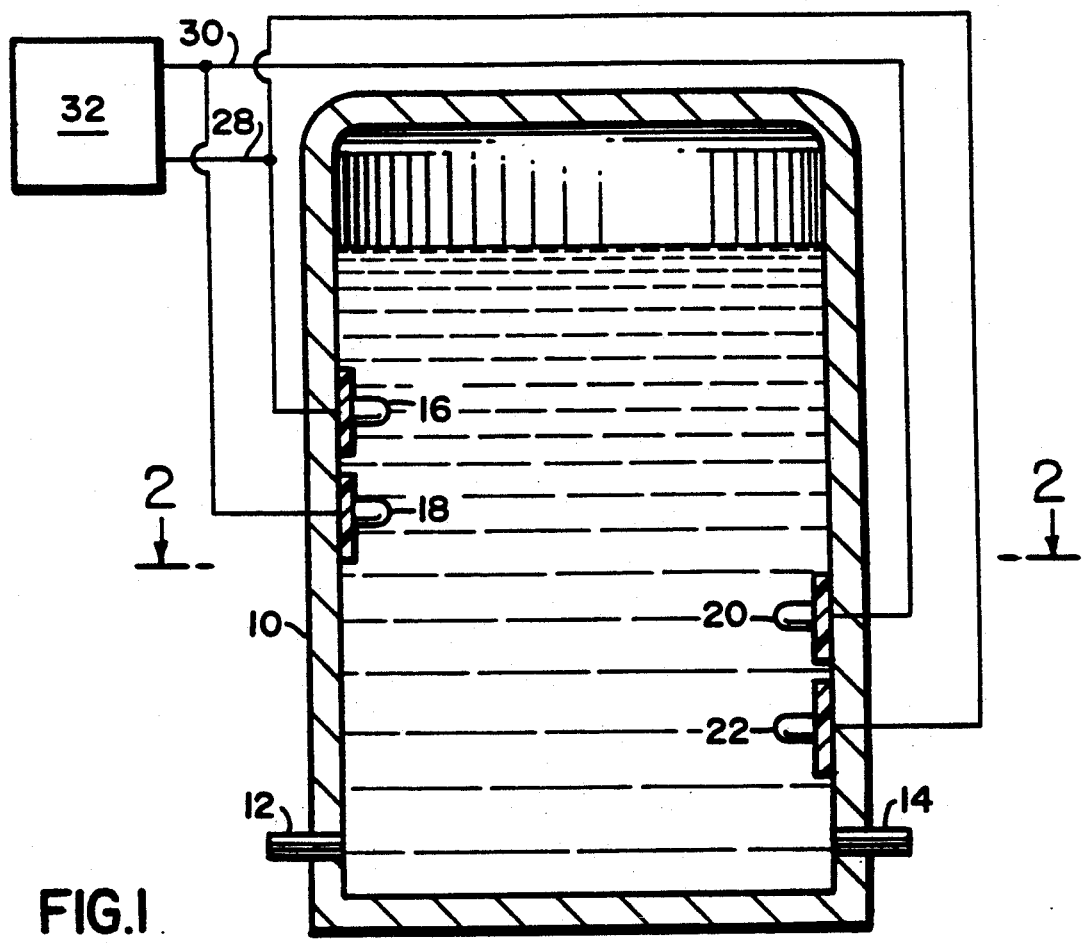
FIG. 1 is a cross-sectional view of a water tank on which are mounted means for applying an electrical AC signal to the water.
Figure 2:
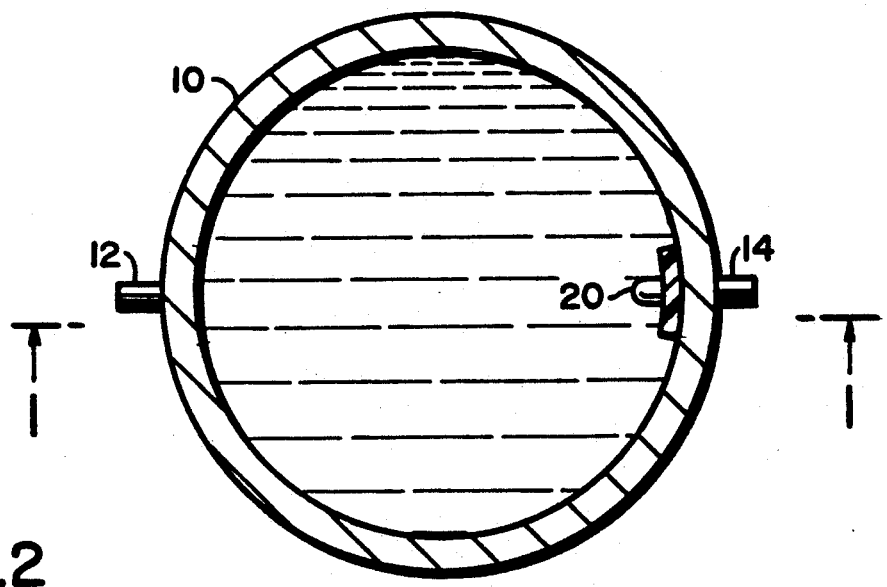
FIG. 2 is a cross-sectional view of the water tank of FIG. 1 taken along the line 2—2.
Figure 3:
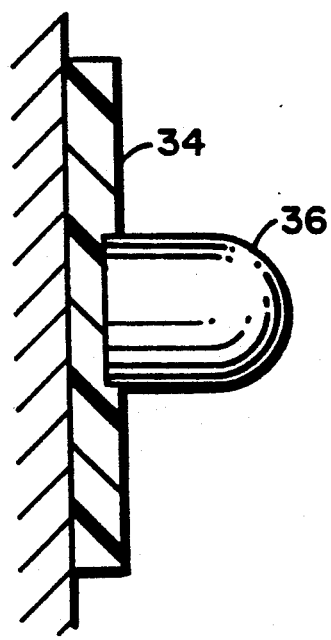
FIG. 3 is a detailed view of an electrode employed in the system of FIGS. 1 and 2.

FIGS. 1-3 and FIGS. 4-6 illustrate two preferred embodiments, respectively, of electrical systems for treating water with an electrical AC signal in accordance with the present invention. The embodiment of FIGS. 1-3 provides a treatment for a quantity of water stored in a tank, for batch processing applications, whereas the embodiment of FIGS. 4-6 applies the electrical AC signal to water which is continuously flowing through a pipe.

Referring first to FIGS. 1-3, there is shown a water tank 10 having inlet and outlet pipes 12 and 14, respectively. The tank may, for example, be made of noncorrosive stainless steel.

Situated at opposite sides of the tank are pairs of electrodes 16, 18 and 20, 22 which are connected, in turn, via wires 28 and 30 to a signal generator 32. This signal generator is of the type disclosed in the aforementioned U.S. Pat. Nos. 4,865,748 and 4,963,268.

The electrodes 16-22 are each mounted on an insulating base 34 which is preferably made of Teflon. As shown in FIG. 3, each electrode 36 is cylindrical and has a dome shaped top.

A signal generator suitable for use with the present invention is available commercially from the Aqua Dynamics Group Corp. in Adamsville, Tennessee. Such a device, called a "Quantum Electronic Device" has a power output of between 5 and 10 watts.

The output frequency of the device is preferably variable to permit selection of the optimum frequency of operation. The power output of the signal generator can be monitored as the frequency is varied so as to select that frequency at which the energy absorption by the water is a maximum. This frequency will probably be in the range of 0.1 KHz to 1 GHz, and most likely will be approximately 50 MHz.

Figure 4:
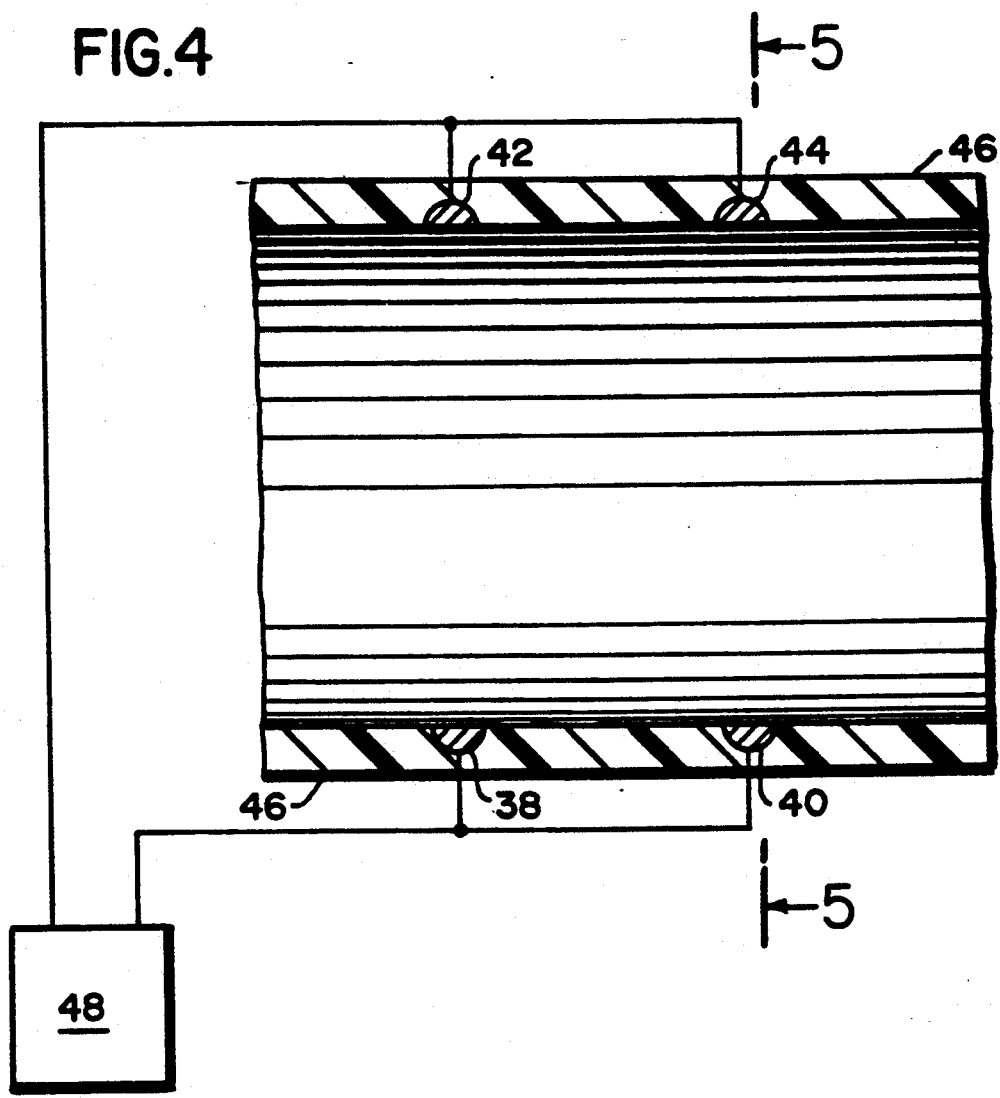
FIG. 4 is a cross-sectional view of a section of a water pipe including means for applying an electrical AC signal.
Figure 5:
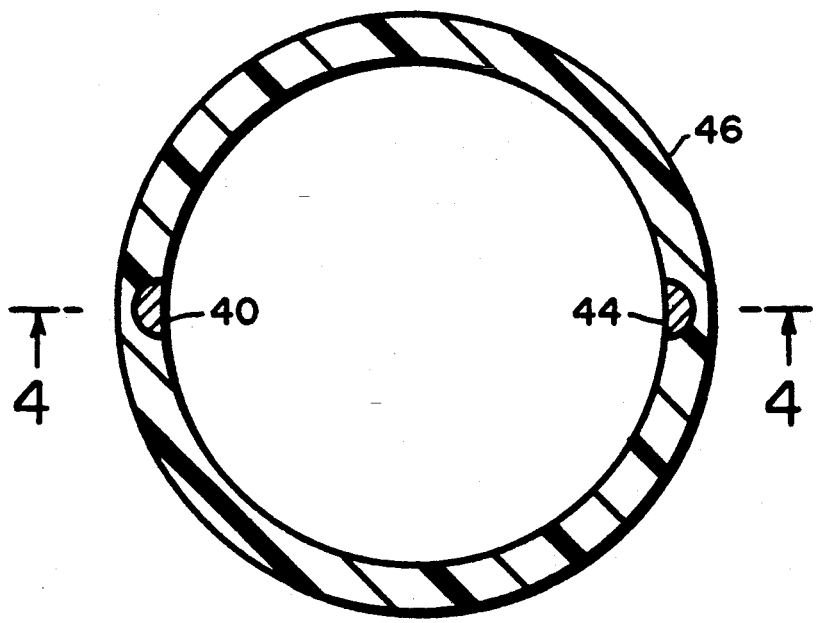
FIG. 5 is a cross-sectional view of the water pipe of FIG. 4 taken along the line 5—5.
Figure 6:
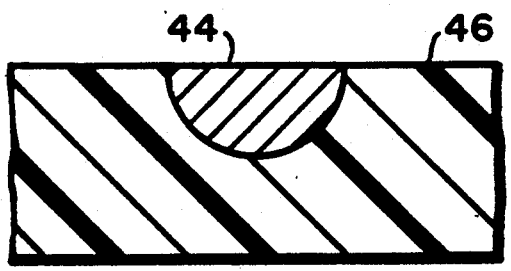
FIG. 6 is a cross-sectional view showing a detail of an electrode employed in the electrical system of FIGS. 4 and 5.

The embodiment of FIGS. 4-6 is very similar to that of FIGS. 1-3, with the exception that the pairs of electrodes 38, 40 and 42, 44 are embedded in a 3 to 5 inch pipe made of insulating material such as Teflon. The electrodes, which are shown in detail in FIG. 6, are hemispherical and are imbedded such that their planar surfaces are substantially flush with the inner surface of the pipe 46.

As in the case of the embodiment of FIGS. 1-3, the pairs of electrodes are connected to a signal generator 48.

The electrodes, in whatever configuration they may be, are made of a substantially inert metal such as stainless steel or platinum. The surfaces of the electrodes are preferably polished smooth.

Assuming adequate pressure, a 3 inch pipe is capable of conducting up to 1000 gallons per minute of water on a continuous basis. A QED signal generator producing 5 to 10 watts of power is capable of treating 1000 gallons of water per minute.

EXAMPLE

Two solid samples and one liquid sample were tested both before and after subjecting them to the electrical treatment according to the present invention. The first solid sample was a mixture of alumina and silica, the second solid was an industrial standard dust (AC-FTD, from AC DELCO), and the liquid sample was purified, deionized water. Solid Sample No. 1 was fine and pure white; Solid Sample No. 2 was very fine and dusty gray.

0.500 grams of these solid samples were suspended in 100 ml. 18-megohm DI water at 22° C. mm long magnetic stirbar. Two sets of each sample were prepared.

After the samples were tested in their original state, they were subjected to a 50 MHz electrical signal at a power of approximately 10 watts applied through two platinum ⅛ inch wires for 6 hours and then tested, as before, after the treatment was stopped.

The following tests were run in triplicate:

1) Particle Size Reduction: In a flow-through cell on a Hiac-Royco Model 8000 particle counter, self-calibrating; set for 1-10, 10-100 and greater than 100 micron measurements, calculated in number per ml.

2) Solubility: A portion of the suspension was filtered through a cleaned Millipore 0.5 micron plastic filter unit, an aliquot was weighed, evaporated to dryness (110° C., 25 mm Hg vacuum) in a tared Platinum dish and weighed and reported as Parts-Per-Million residue by weight. Any residue was taken up in Hydrochloric and Hydrofluoric Acids and qualitatively scanned by D-C Plasma; the major elements found were reported.

3) Surface Tension/Capillary Activity: Measured by placing a cleaned, precision-bore 0.6 mm Pyrex glass capillary tube a fixed distance into the sample and measuring the final, stable height of rise in the tube from the liquid's surface in mm.

The following table lists the average value for the measured properties tested in each sample. The relative standard deviation for the six data points (triplicate readings on duplicate preparations) is listed under the data value in brackets.

| Test Procedure | Before | After | Before | After |
| --- | --- | --- | --- | --- |
| | Solid Sample No. 1 | | Solid Sample No. 2 | |
| Particle Size/1 um range | 4800 [11%] | 17000 [14%] | 46200 [17%] | 12800 [22%] |
| 10 um range | 16700 [8%] | 12500 [11%] | 21500 [15%] | 18800 [24%] |
| 100 um range | 9500 [17%] | 8200 [21%] | 12400 [13%] | 10100 [18%] |
| Solubility | 10 PPM [35%] | 225 PPM [9.5%] | 165 PPM [7.6] | 1050 PPM [4.3%] |
| | Liquid Sample | | | |
| Surface Tension | 21.7 mm [7%] | 24.7 mm [8%] | | |

The overall range of error on the measurements was excellent relative to the nature of the equipment used. The solubility weighings were done on a Sartorius 4.5 place semi-micro analytical balance, and gave acceptable reproducibility even with the original Solid Sample No. 1 at only ~10 PPM residue.

The solid samples exhibited a marked increase in solubility after the AC signal treatment. Presumably, the sample matrices were affected by the interaction with the RF energy which appears as changes in solubility. Colorimetric spot tests on the treated samples confirmed that the elements were present as ionic species, not as colloidal or suspended matter.

This data coincides with the measured overall size reduction of the particles in suspension, showing that more solid sample entered solution, leaving behind less total particles as the small ones disappeared and the larger ones got proportionally smaller.

As in the evaluation of the solid samples, the application of the electrical AC signal energy to the solubilized components in the liquid sample appeared to effect some physical and chemical constants of these species. The sample exhibited a marked reduction in surface tension (as a function of capillary action). Such a change is usually induced by surfactants or polymeric materials which increase the "wetness" of the water. It is theorized that the electrical energy changed the normal "clustering" or coordination of the species present, which manifested itself as a change in surface tension.

There has thus been shown and described a novel method of cleaning semiconductor wafers and computer storage disks which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention, which is to be limited only by the claims which follow.

What is claimed is:

1. A method of cleaning semiconductor wafers, comprising the steps of:
    (a) treating purified water with an electrical AC signal to alter its cleansing characteristics; said AC signal being at a frequency in the range of 0.1 KHz to 1 GHz,
    (b) rinsing a semiconductor wafer with the treated, purified water to remove contaminants.

2. The method defined in claim 1, wherein said frequency is about 50 MHz.

3. The method defined in claim 1, wherein said frequency is that at which the energy absorption by said water is a maximum.

4. The method defined in claim 1, wherein said purified water is deionized.

5. The method defined in claim 1, wherein said water is filtered and treated again with said AC signal after said rinsing step, and thereafter used again in rinsing a semiconductor wafer to remove contaminants.

6. The method defined in claim 5, wherein said water is continuously recycled for repeated use in rinsing a semiconductor wafer.

7. A method of cleaning computer storage disks, comprising the steps of:
    (a) treating purified water with an electrical AC signal to alter its cleansing characteristics, said AC signal being at a frequency in the range of 0.1 KHz to 1 GHz;
    (b) rinsing a computer storage disk with the treated, purified water to remove contaminants.

8. The method defined in claim 7, wherein said frequency is about 50 MHz.

9. The method defined in claim 7, wherein said frequency is that at which the energy absorption by said water is a maximum.

10. The method defined in claim 7, wherein said purified water is deionized.

11. The method defined in claim 7, wherein said water is filtered and treated again with said AC signal after said rinsing step, and thereafter used again in rinsing a computer storage disk to remove contaminants.

12. The method defined in claim 11, wherein said water is continuously recycled for repeated use in rinsing a computer storage disk.

* * * * *